US008445891B2

(12) United States Patent
Jeon et al.

(10) Patent No.: US 8,445,891 B2
(45) Date of Patent: May 21, 2013

(54) NITRIDE BASED SEMICONDUCTOR DEVICE AND METHOD FOR MANUFACTURING THE SAME

(75) Inventors: Woochul Jeon, Gyeonggi-do (KR); Kiyeol Park, Gyeonggi-do (KR); Younghwan Park, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 46 days.

(21) Appl. No.: 13/049,403

(22) Filed: Mar. 16, 2011

(65) Prior Publication Data
US 2012/0146052 A1 Jun. 14, 2012

(30) Foreign Application Priority Data
Dec. 9, 2010 (KR) .................. 10-2010-0125288

(51) Int. Cl.
H01L 29/06 (2006.01)
H01L 29/10 (2006.01)
H01L 29/423 (2006.01)
H01L 29/66 (2006.01)
H01L 29/778 (2006.01)
H01L 29/20 (2006.01)

(52) U.S. Cl.
USPC ............. 257/22; 257/194; 257/282; 257/284; 257/472; 257/745; 438/172; 438/571; 438/572; 438/578

(58) Field of Classification Search
USPC .................. 257/183, 473, 481, E29.002
See application file for complete search history.

(56) References Cited

U.S. PATENT DOCUMENTS

| 4,982,260 | A | 1/1991 | Chang et al. |
| 2003/0098462 | A1* | 5/2003 | Yoshida ......................... 257/183 |
| 2005/0161758 | A1 | 7/2005 | Chiola |
| 2005/0179104 | A1* | 8/2005 | Shelton et al. ............... 257/471 |
| 2010/0140660 | A1* | 6/2010 | Wu et al. ....................... 257/183 |

FOREIGN PATENT DOCUMENTS

| JP | 2006-156457 | 6/2006 |
| KR | 10-2006-01267 12 | 12/2006 |

OTHER PUBLICATIONS

Korean Office Action issued in Korean Patent Application No. 10-2010-0125288 dated Mar. 29, 2012.

* cited by examiner

Primary Examiner — Olik Chaudhuri
Assistant Examiner — Wilner Jean Baptiste
(74) Attorney, Agent, or Firm — McDermott Will & Emery LLP

(57) ABSTRACT

Disclosed herein is a nitride based semiconductor device. There is provided a nitride based semiconductor device including: a base substrate; an epitaxial growth layer disposed on the base substrate and generating 2-dimensional electron gas (2DEG) therein; and an electrode structure disposed on the epitaxial growth layer and having an extension extending into the epitaxial growth layer, wherein the epitaxial growth layer includes a depressing part depressed thereinto from the surface of the epitaxial growth layer, and the depressing part includes: a first area in which the extension is disposed; and a second area that is an area other than the first area.

8 Claims, 7 Drawing Sheets

100a

100a

US 8,445,891 B2

NITRIDE BASED SEMICONDUCTOR DEVICE AND METHOD FOR MANUFACTURING THE SAME

CROSS REFERENCE(S) TO RELATED APPLICATIONS

This application claims the benefit under 35 U.S.C. Section 119 of Korean Patent Application Serial No. 10-2010-0125288, entitled "Nitride Based Semiconductor Device And Method For Manufacturing The Same" filed on Dec. 9, 2010, which is hereby incorporated by reference in its entirety into this application.

BACKGROUND OF THE INVENTION

1. Technical Field

The present invention relates to a nitride based semiconductor device and a method for manufacturing the same, and more particularly, to a nitride based semiconductor device and a method for manufacturing the same capable of being operated forward at a low turn-on voltage and increasing withstand voltage at the time of a reverse operation.

2. Description of the Related Art

A schottky diode among semiconductor devices is a device using a schottky contact that is a junction of a metal and a semiconductor. Among schottky diodes, the nitride based semiconductor device using 2-dimensional electron gas (2DEG) as a current moving channel may be configured to include a base substrate such as a sapphire substrate, an epitaxial growth layer disposed on the base substrate, and a schottky electrode and an ohmic electrode disposed on the epitaxial growth layer. Generally, the schottky electrode is used as an anode and the ohmic electrode is used as a cathode.

However, the nitride based semiconductor schottky diode having the above structure has a trade-off relation between satisfying low turn-on voltage and low turn-off current and increasing withstand voltage at the time of a reverse operation. Therefore, it is very difficult to implement a technical of lowering a forward turn-on voltage while increasing the withstand voltage of a general nitride based semiconductor device at the time of the reverse operation.

SUMMARY OF THE INVENTION

An object of the present invention is to provide a nitride based semiconductor device capable of being operated at low turn-on voltage.

Another object of the present invention is to provide a nitride based semiconductor device capable of increasing withstand voltage at the time of a reverse operation.

According to an exemplary embodiment of the present invention, there is provided a nitride based semiconductor device, including: a base substrate; an epitaxial growth layer disposed on the base substrate and generating 2-dimensional electron gas (2DEG) therein; and an electrode structure disposed on the epitaxial growth layer and having an extension extending into the epitaxial growth layer, wherein the epitaxial growth layer includes a depressing part depressed thereinto from the surface of the epitaxial growth layer, and the depressing part includes: a first area in which the extension is disposed; and a second area that is an area other than the first area.

The electrode structure may include a schottky electrode schottky-contacting the epitaxial growth layer, and the extension may be provided in the schottky electrode.

The electrode structure may include an ohmic electrode ohmic-contacting the epitaxial growth layer, and the extension may be provided in the ohmic electrode.

The extension may contact the 2-dimensional electron gas (2DEG) at the side portion thereof.

The epitaxial growth layer may include: a lower nitride layer grown on the base substrate using the base substrate as a seed layer; and an upper nitride layer disposed on the lower nitride layer using the lower nitride layer as a seed layer and having a wider energy band gap than that of the lower nitride layer, wherein the extension extends to the inside of the lower nitride layer, penetrating through the upper nitride layer.

The extension may non-contact the 2-dimensional electron gas.

The epitaxial growth layer may include: a lower nitride layer grown on the base substrate using the base substrate as a seed layer; and an upper nitride layer disposed on the lower nitride layer using the lower nitride layer as a seed layer and having a wider energy band gap than that of the lower nitride layer, wherein the extension extends into the upper nitride layer to non-contact the 2-dimensional electron gas.

The second area may be disposed to approach the ohmic electrode, as compared with the first area.

The nitride based semiconductor device may further include a passivation layer covering the second area.

The second area may be used as a field plate dispersing an electric field generated at an interface between the schottky electrode and the epitaxial growth layer.

The electrode structure may include: an ohmic electrode provided to have a plate shape on one side of the epitaxial growth layer and ohmic-contacting the epitaxial growth layer; and a schottky electrode opposite to the ohmic electrode on the other side of the epitaxial growth layer and schottky-contacting the epitaxial growth layer, wherein the extension is locally disposed along the side of the schottky electrode opposite to the ohmic electrode.

The electrode structure may include: a schottky electrode disposed in the central area of the epitaxial growth layer and schottky-contacting the epitaxial growth layer; and an ohmic electrode disposed along the edge area of the epitaxial growth layer to have a ring shape surrounding the schottky electrode and ohmic-contacting the epitaxial growth layer, wherein the extension is locally disposed along the side of the schottky electrode opposite to the ohmic electrode.

The depressing part may be formed during a mesa process for electrically separating devices.

The base substrate may include at least any one of a silicon substrate, a silicon carbide substrate, and a sapphire substrate.

DESCRIPTION OF THE PREFERRED EMBODIMENTS

Figure 1:
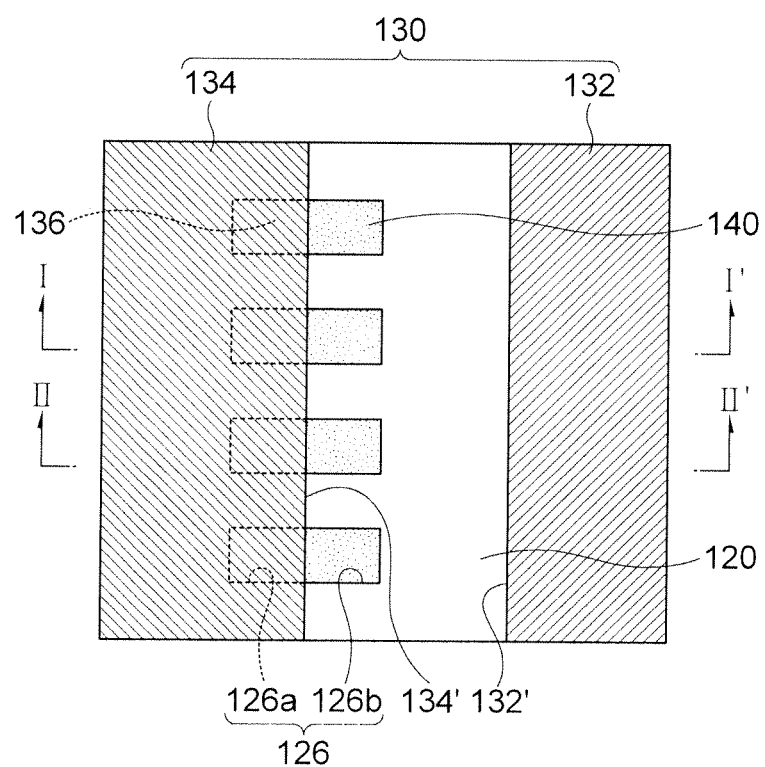
FIG. 1 is a plan view showing a nitride based semiconductor device according to an exemplary embodiment of the present invention.

Various advantages and features of the present invention and methods for accomplishing them will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals throughout the present specification denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

In addition, the embodiments described in the present specification will be described with reference to cross section views and/or plan views as exemplary views. In the drawings, the thicknesses of layers and regions are exaggerated for effective description of technical contents. Accordingly, shapes of the exemplary views may be changed by manufacturing techniques and/or allowable errors. The embodiments of the present invention are not limited to drawn specific shapes, but include changes of shapes generated according to the manufacturing process. For example, an etch region drawn at a right angle may be rounded or may have a certain curvature. Therefore, the regions viewed in the drawings have rough attributes, and the configurations of the regions viewed in the drawings are for illustrating specific forms but not limiting the scope of the present invention.

Figure 2:
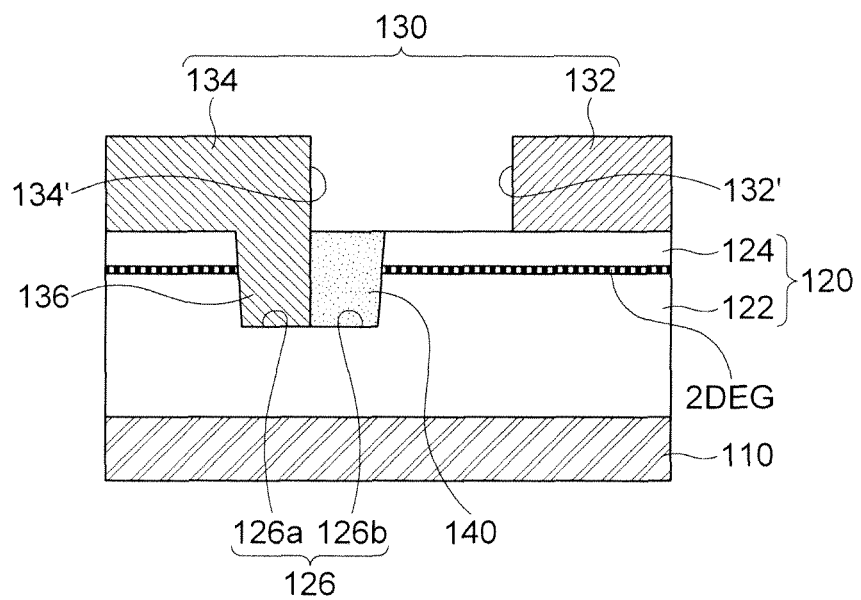
FIG. 2 is a cross-sectional view taken along line I-I' of FIG. 1.
Figure 3:
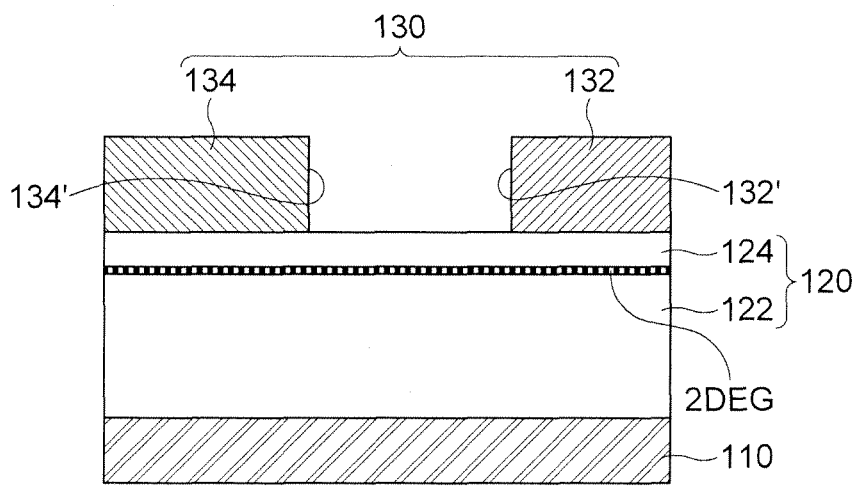
FIG. 3 is a cross-sectional view taken along line II-II' of FIG. 1.

FIG. 1 is a plan view showing a nitride based semiconductor device according to an exemplary embodiment of the present invention and FIG. 2 is a cross-sectional view taken along line I-I' of FIG. 1. FIG. 3 is a cross-sectional view taken along line II-II' of FIG. 1.

Referring to FIGS. 1 to 3, a nitride based semiconductor device 100 according to an exemplary embodiment of the present invention may be configured to include a base substrate 110, an epitaxial growth layer 120, and an electrode structure 130.

The base substrate 110 may be a base for forming the epitaxial growth layer 120 and the electrode structure 130. As the base substrate 110, various kinds of substrates may be used. For example, as the base substrate 110, any one of a silicon substrate, a silicon carbide substrate, and a sapphire substrate may be used.

The epitaxial growth layer 120 may be configured to include a lower nitride layer 122 and an upper nitride layer 124 that are sequentially stacked on the base substrate 112. The upper nitride layer 124 may be made of a material having a wider energy band gap than that of the lower nitride layer 122. In addition, the upper nitride layer 124 may be made of a material having a lattice parameter different from that of the lower nitride layer 122. For example, the lower nitride layer 122 and the upper nitride layer 124 may be layers including III-nitride based materials. In more detail, the lower nitride layer 122 may be made of any one of gallium nitride (GaN), aluminum gallium nitride (AlGaN), indium gallium nitride (InGaN), and indium aluminum gallium nitride (InAlGaN), and the upper nitride layer 124 may be made of the other one of gallium nitride (GaN), aluminum gallium nitride (AlGaN), indium gallium nitride (InGaN), and indium aluminum gallium nitride (InAlGaN). As an example, the lower nitride layer 122 may be a gallium nitride (GaN) layer, and the upper nitride layer 124 may be an aluminum gallium nitride (AlGaN) layer.

The epitaxial growth layer 120 may be formed by an epitaxial growth process. For example, the epitaxial growth layer 120 may be formed by any one of at least any one of a molecular beam epitaxial growth process, an atomic layer epitaxial growth process, a flow modulation organometallic vapor phase epitaxial growth process, a flow modulation organometallic vapor phase epitaxial growth process, and a hybrid vapor phase epitaxial growth process.

In the epitaxial growth layer 120, the second-dimensional electron gas (2DEG) may be generated at a boundary between the lower nitride layer 122 and the upper nitride layer 124. At the time of the switching operation of the nitride based semiconductor device 100, current may flow through the second-dimensional electron gas (2DEG).

In this case, a buffer layer (not shown) may be interposed between the base substrate 110 and the epitaxial growth layer 120. The buffer layer may be a layer to reduce the occurrence of defects due to a lattice mismatch between the base substrate 110 and the epitaxial growth layer 120. To this end, the buffer layer may have a super-lattice layer structure in which thin films made of heterogeneous materials are alternately stacked. The super-lattice layer may have a multi-layer structure in which an insulator layer and a semiconductor layer are alternately grown.

The electrode structure 130 may be disposed on the semiconductor layer 120. The electrode structure 130 may have an ohmic electrode 132 and a schottky electrode 134. The ohmic electrode 132 may ohmic-contact with the semiconductor layer 120 and the schottky electrode unit 134 may be a metal layer schottky-contacting the semiconductor layer 120. The above-mentioned ohmic electrode 132 is used as a cathode of the nitride based semiconductor device 100 and the schottky electrode 134 may be used as an anode of the nitride based semiconductor device 100.

The ohmic electrode 132 may be disposed at one area of the semiconductor layer 120. The ohmic electrode 132 may substantially have a plate shape. The schottky electrode 134 may be disposed in the other area of the semiconductor layer 120 to be spaced apart from the ohmic electrode 132. In this case, the side of the ohmic electrode 132 (hereinafter, 'first side 132') opposite to the schottky electrode 134 and the side (hereinafter, a second side 134') of the schottky electrode 134 opposite to the ohmic electrode 132 may be substantially parallel with each other.

Meanwhile, the schottky electrode 134 may have a structure extending into the epitaxial growth layer 120 to contact the 2-dimensional electron gas (2DEG). For example, the schottky electrode 134 may have an extension 136 extending into the epitaxial growth layer 120 to contact the 2-dimensional electron gas (2DEG). The extension 136 may have a structure substantially extending downward to face the epitaxial growth layer 120 in an area adjacent to the second side 131'

In addition, the extension 136 may be locally provided along the second side 134'. For example, the extension 136 may be provided in plural. In this case, the extensions 136 may be disposed to be spaced apart from each other by a predetermined interval along the second side 134'. The extensions 136 may substantially have an island-shaped transverse section. For example, the extensions 136 may have a quadrangular transverse section. In addition, each of the extensions 136 passes through a portion in which the 2-dimensional electron gas (2DEG) is generated to extend into the lower nitride layer 122. That is, each of the extensions 136 may also have a structure extending from the side portion thereof to the inside of the lower nitride layer 122 to contact the 2-dimensional electron gas (2DEG). Therefore, each of the extensions 136 may have a structure in which it passes through a boundary surface between the lower nitride layer 122 and the upper nitride layer 124 and extends to an inner area of the lower nitride layer 122.

Meanwhile, the epitaxial growth layer 120 may be formed with the depressing part 126 into which the extension 136 is inserted so that the extension 136 is provided in the epitaxial growth layer 120. For example, the depressing part 126 may be a groove into which the extension 136 is inserted. When the extension 136 is provided in plural, the depressing part 126 may also be disposed to be provided in plural along the second side 134'. Each of the depressing parts 126 may have an island-shaped transverse section.

The depressing parts 126 having the above-mentioned structure may be formed by performing a predetermined etch process on the epitaxial growth layer 120. As an example, the depressing parts 126 may be formed by performing a photolithography process. As another example, the depressing parts 126 may be formed during a mesa process. In more detail, the nitride based semiconductor devices is manufactured in a substrate level state and then, each nitride based semiconductor device may be separate into unit devices by using the mesa process that is a process of electrically separating the devices on the substrate. The mesa process may be performed to form a predetermined trench at a boundary between the nitride based semiconductor devices. In this case, the depth of the trench may be controlled to expose the lower nitride layer 124 of the epitaxial growth layer 120. Therefore, since the depressing part 126 is formed by using the mesa process used to electrically separate the nitride based semiconductor devices, the method for manufacturing a nitride based semiconductor device according to the exemplary embodiment of the present invention may form the depressing part 126 through the mesa process, without additionally performing the process of forming a separate depressing part.

The extension 136 may be formed to cover only a portion of the depressing part 126. For example, the extension 136 covers some area of the depressing part 126 to selectively expose a portion of the depressing part 126 relatively more close to the ohmic electrode 132. Therefore, the depressing part 126 may be divided into a first area 126a into which the extension 136 is inserted and a second area 126b that is an area other than the first area 126a. The first area 126a and the second area 126b may be divided based on the second side 134' and the second area 126b may be positioned to be more close to the ohmic electrode 132 than to the first area 126a.

The second area 126b may be covered with a predetermined insulating layer. For example, the nitride based semiconductor device 100 may further include a passivation layer 140 covering the second area 126b. In addition, the passivation layer 140 may be provided to cover the epitaxial growth layer 120 exposed between the ohmic electrode 132 and the schottky electrode 134. The passivation layer 140 may be any one of an oxide layer and a nitride layer. As one example, the passivation layer 140 may be formed of any one of a silicon oxide layer, a silicon nitride layer, and an aluminum oxide layer. As another example, the passivation layer 140 may be formed of at least any one of a hafnium oxide layer, a hafnium nitride layer, a hafnium silicate layer, a zirconium oxide layer, a zirconium silicate layer, and an aluminum silicate layer.

Meanwhile, the exemplary embodiment of the present invention describes, by way of example, the case where only the schottky electrode 134 of the electrode structure 130 has a structure extending into the epitaxial growth layer 120 to contact the 2-D electron gas (2DEG). Further, the ohmic electrode 132 may have a structure extending into the epitaxial growth layer 120 to contact the 2-D electron gas (2DEG). In this case, since the ohmic electrode 132 has a structure contacting the 2-D electron gas (2DEG), a current direction from the schottky electrode 134 to the ohmic electrode 132 is substantially a horizontal direction, such that the current moving path may be shortened.

The schottky electrode 134 having the above-mentioned structure directly contacts the 2-dimensional electron gas (2DEG) defining the current moving path of the nitride based semiconductor device 100, such that it may have a resistance value approaching 0. Therefore, the schottky electrode 134 may have electrode characteristics similar to an ohmic contact In this case, the nitride based semiconductor device 100 may be operated forward even at the remarkably lower voltage than the schottky electrode non-contacting the 2-dimensional electron gas (2DEG). Therefore, the turn-on voltage at the time of the forward operation of the device 100 may be reduced, such that the device 100 may be operated even at the low turn-on voltage.

Next, a detailed operation process of a nitride based semiconductor device according to an exemplary embodiment of the present invention will be described in detail. In this configuration, the overlapped description of the nitride based semiconductor device 100 described with reference to FIGS. 1 and 3 may be omitted or simplified.

Figure 4A:
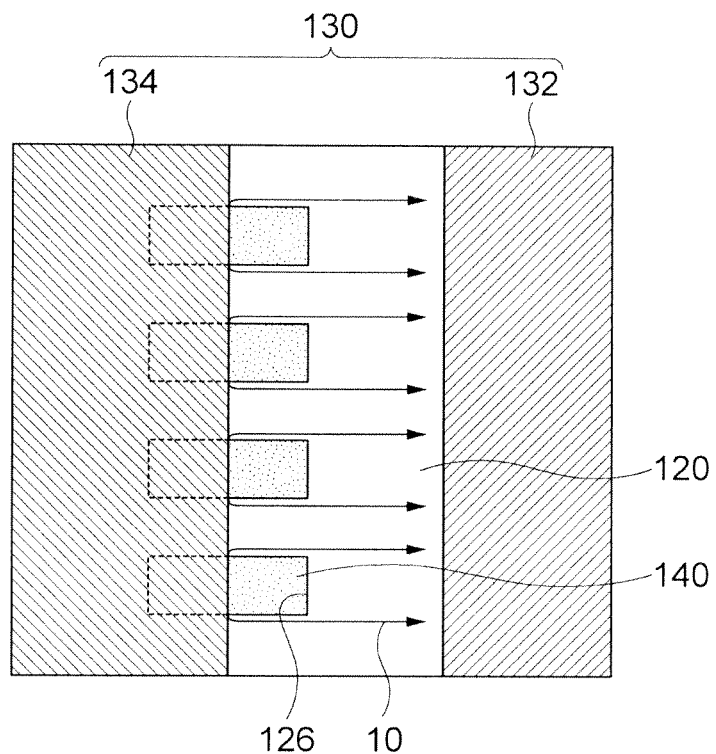
FIGS. 4A to 4C are diagrams for explaining a detailed operational process of a nitride based semiconductor device according to an exemplary embodiment of the present invention.
Figure 4B:
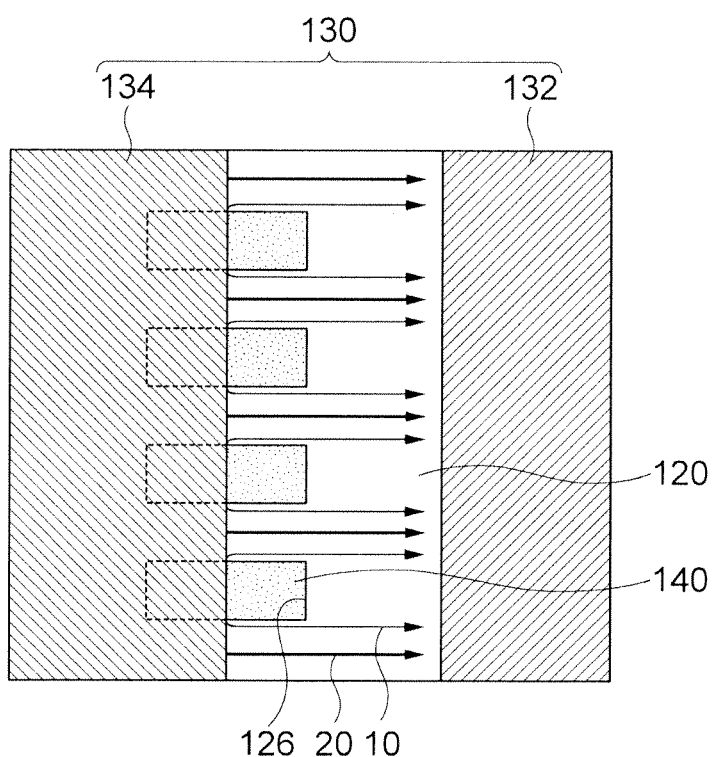
Figure 4C:
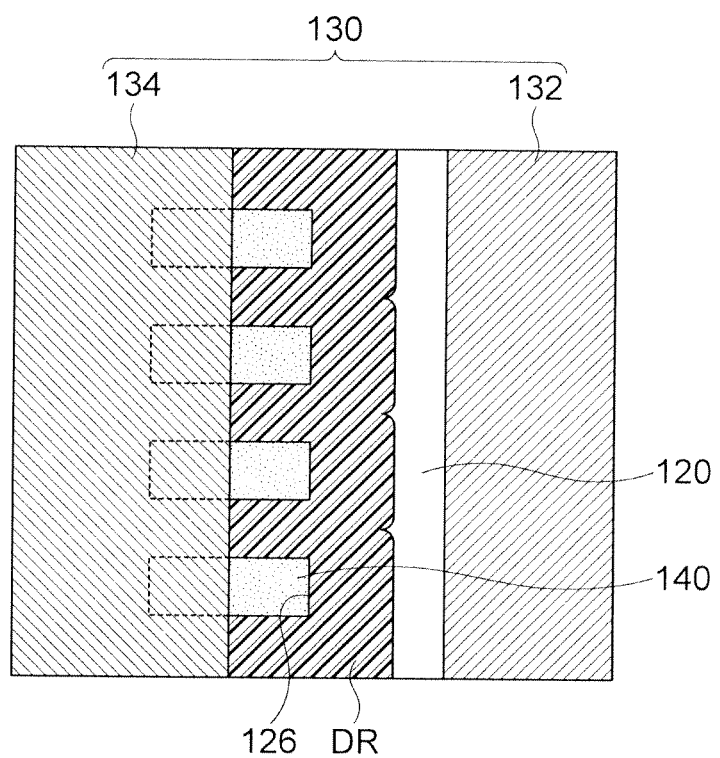

FIGS. 4A to 4C are diagrams for explaining a detailed operational process of a nitride based semiconductor device according to an exemplary embodiment of the present invention. In more detail, FIG. 4A is a diagram showing a current flow when a lower voltage than the turn-on voltage of the schottky electrode is applied, when the nitride based semiconductor device according to the exemplary embodiment of the present invention is driven forward. FIG. 4B is a diagram showing a current flow when a higher voltage than the turn-on voltage of the schottky electrode is applied to the nitride based semiconductor device, when the nitride based semiconductor device according to the exemplary embodiment of the present invention is driven forward. FIG. 4C is a diagram showing a shape of blocking a current flow through the 2-D electron gas by the depletion area of the schottky junction by applying a reverse driving voltage to the nitride based semiconductor device according to the exemplary embodiment of the present invention.

Referring to FIG. 4A, when the nitride based semiconductor device according to the exemplary embodiment of the present invention is driven forward at the relatively lower voltage than the turn-on voltage of the schottky electrode 134, the current flow from the schottky electrode 134 to the ohmic electrode 132 may be selectively made through a portion contacting the 2-dimensional electron gas (2DEG) of the electrode structure 130. That is, the junction of the electrode structure 130 and the 2-dimensional electron gas (2DEG) may be a side portion of the extension 136 of the schottky electrode 134. Therefore, current 10 may flow in the ohmic electrode 132 through the 2-dimensional electron gas (2DEG) from the side portion of the extension 136 of the schottky electrode 134 contacting the 2-dimensional electron gas (2DEG).

Referring to FIG. 4B, when the nitride based semiconductor device according to the exemplary embodiment of the present invention is driven forward at the higher voltage than the turn-on voltage of the schottky electrode 134, the current may flow from the schottky electrode 134 to the ohmic electrode 132 through the remaining portion, together with a portion contacting the 2-dimensional electron gas (2DEG) of the electrode structure 130. That is, current 20 may flow from the schottky electrode 134 non-contacting the 2-dimensional electron gas (2DEG) to the ohmic electrode 132 through the 2-dimensional electron gas (2DEG), together with the current 10 flowing from the extension 136 to the ohmic electrode 132 as described with reference to FIG. 4A.

Referring to FIG. 4C, when the nitride based semiconductor device according to the exemplary embodiment of the present invention starts to be applied with a voltage at the time of being driven reversely, the current flow from the schottky electrode 134 to the ohmic electrode 132 may be blocked by a depletion region (DR) caused by the schottky contact of the schottky electrode 134. Further, when the magnitude in the reverse voltage is increased, the depletion area DR is expanded, such that the current flow may be completely blocked. In this case, the electric field concentrated at the boundary of the schottky electrode 134 contacting the epitaxial growth layer 120 may be dispersed by the depressing part 126, thereby making it possible to increase the withstand voltage at the time of the reverse operation. That is, the depressing part 126 may be used as a field plate dispersing the electric field concentrated on the schottky electrode 134 at the time of the reverse operation of the device.

As described above, the nitride based semiconductor device 100 according to the exemplary embodiment of the present invention may be configured to include the base substrate 110, the epitaxial growth layer 120 generating the 2-dimensional electron gas (2DEG), and the schottky electrode 134 formed on the epitaxial growth layer 120 and having an extension 136 extending into the epitaxial growth layer 120 to directly contact the 2-dimensional electron gas (2DEG). In this case, the extension 136 of the schottky electrode 134 contacts the 2-dimensional electron gas (2DEG) to minimize the current resistance value, such that it may be similarly operated to the ohmic contact. Therefore, the nitride based semiconductor device according to the exemplary embodiment of the present invention moves the current through the portion of the electrode structure contacting the 2-dimensional electron gas when the driving voltage is driven at a lower voltage than the turn-on voltage of the schottky diode at the time of the forward operation and moves current through a contact point between the entire schottky electrode and the 2-dimensional electron gas at the time of being driven at voltage higher than the turn-on voltage, thereby making it possible to be operated at the low turn-on voltage and increase the forward current amount.

In addition, the nitride based semiconductor device 100 according to the exemplary embodiment of the present invention includes the ohmic electrode 132 and the schottky electrode 134 disposed on the epitaxial growth layer 120 to be spaced apart from each other. The epitaxial growth layer 120 may be provided the depressing parts 126 locally provided along the side 134' of the schottky electrode 134 opposite to the ohmic electrode 132. The depressing parts 126 may be provided as a configuration of dispersing the electric field concentrated on the schottky electrode 134 of the electrode structure 130 at the time of the reverse operation of the device 100. Therefore, the nitride based semiconductor device according to the exemplary embodiment of the present invention locally provides the depressing part in the epitaxial growth layer area between the ohmic electrode and the schottky electrode to disperse the electric field concentrated on the schottky electrode due to the depressing part at the time of the reverse operation, thereby making it possible to increase the reverse withstand voltage.

Hereinafter, a modified example of the nitride-based semiconductor device according to an embodiment of the present invention will be described in detail. In this configuration, the overlapped description of the nitride based semiconductor device 100 described with reference to FIGS. 1 and 2 may be omitted or simplified.

Figure 5:
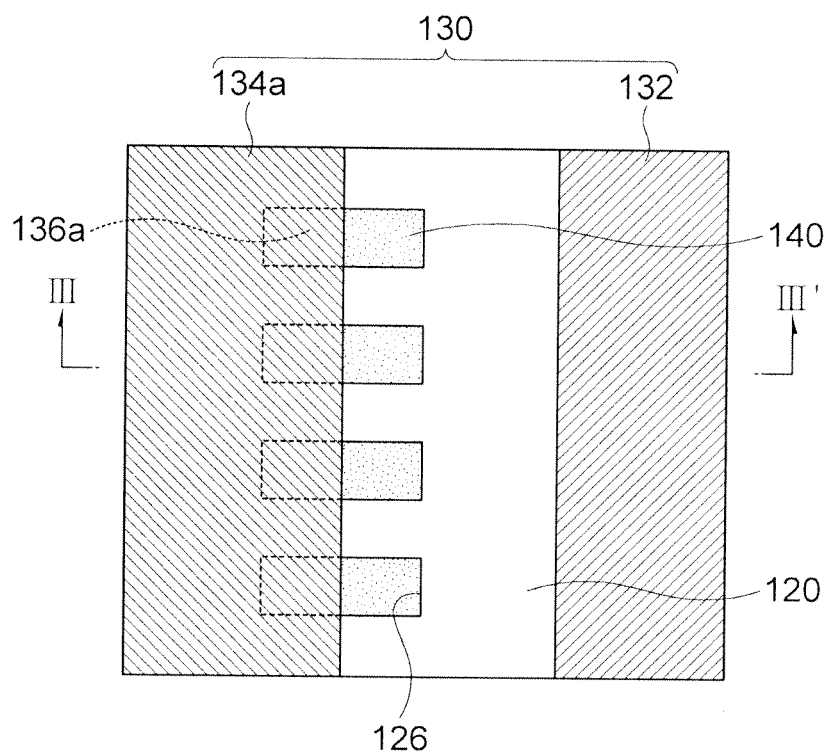
FIG. 5 is a diagram showing a modified example of a nitride based semiconductor device according to the exemplary embodiment of the present invention.
Figure 6:
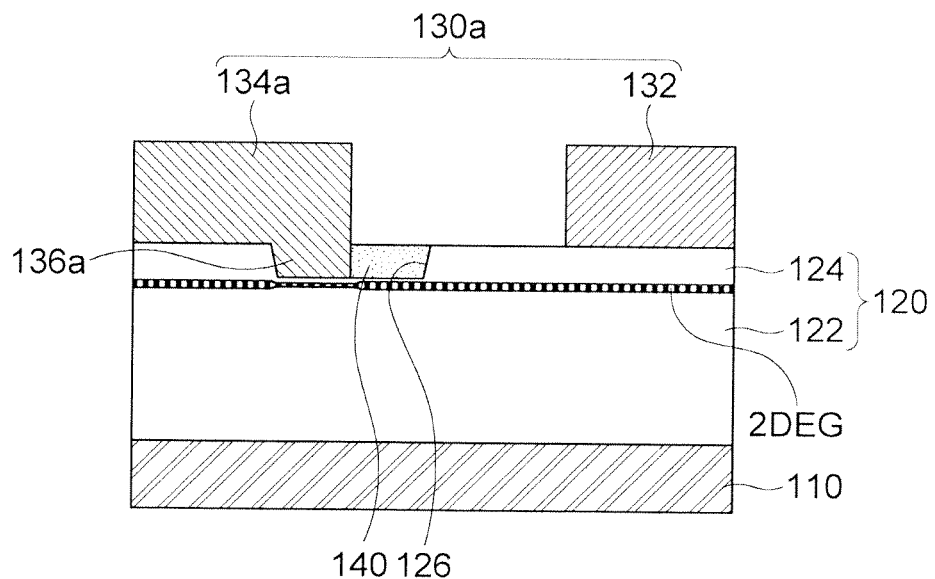
FIG. 6 is a cross-sectional view taken along line of FIG. 5.

FIG. 5 is a plan view showing a modified example of a nitride based semiconductor device according to the exemplary embodiment of the present invention and FIG. 6 is a cross-sectional view taken along line III-III' of FIG. 5.

Referring to FIGS. 5 and 6, a nitride based semiconductor device 100a according to a modified example of the present invention may include an electrode structure 130a having an extension 136a non-contacting the 2-dimensional electron gas (2DEG) different from the nitride based semiconductor device 100 with reference to FIG. 1.

In more detail, the nitride based semiconductor device 100a includes the base substrate 110, the epitaxial growth layer 120 disposed on the base substrate 110, and the electrode structure 130a disposed on the epitaxial growth layer 120, wherein the electrode structure 130a may include the ohmic electrode 132 and the schottky electrode 134a. The schottky electrode 134a is disposed on the epitaxial growth layer 120, wherein the extension 136a may have a structure extending into the epitaxial growth layer 120 to be adjacent to the 2-dimensional electron gas (2DEG) under the conditions where it does not contact to the 2-dimensional electron gas (2DEG). For example, the extension 136a may extend into the upper nitride layer 124 so that it does not contact the lower nitride layer 122 of the epitaxial growth layer 120. To this end, the upper nitride layer 124 may be provided with the depressing part 126 into which the extension 136a is inserted. The area of the depressing part 126 in which the extension 136a is not disposed may be protected by being covered by the passivation layer 140.

Meanwhile, a portion of the 2-dimensional electron gas (2DEG) adjacent to the extension 136a may relatively reduce the concentration of the 2-dimensional electron gas (2DEG), as compared with the remaining portion. In the nitride based semiconductor device 100a having the above-mentioned structure, the extension 136a of the schottky electrode 134a may have a structure non-contacting the 2-dimensional electron gas (2DEG). In this case, the schottky electrode 134a has a low turn-on resistance value, such that it may substantially have electrode characteristics similar to the ohmic contact. In this case, the nitride based semiconductor device 100a may be operated forward even at the remarkably lower voltage than the schottky electrode non-contacting the 2-dimensional electron gas (2DEG).

Figure 7:
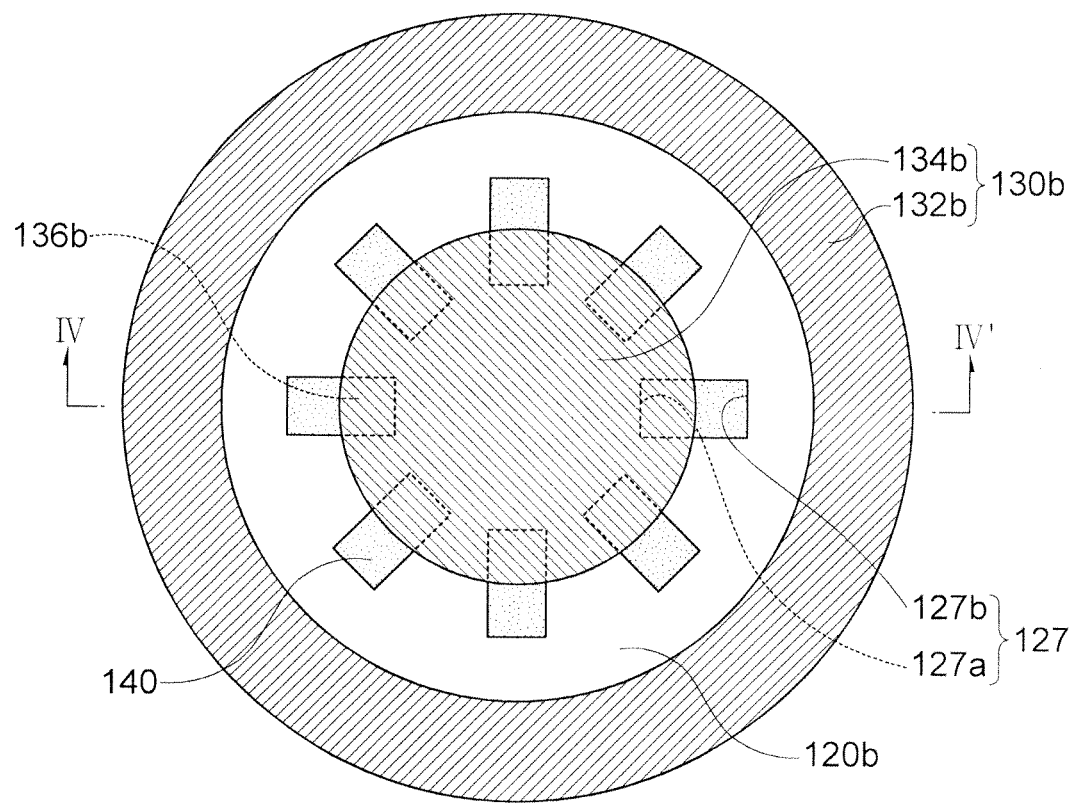
FIG. 7 is a diagram showing another modified example of the nitride based semiconductor device according to the exemplary embodiment of the present invention.
Figure 8:
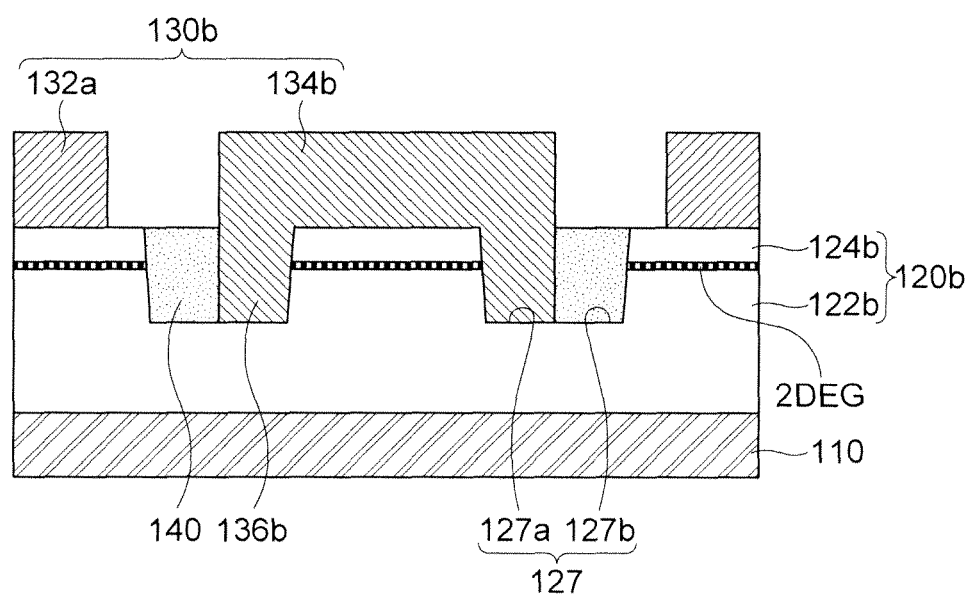
FIG. 8 is a cross-sectional view taken along line IV-IV' of FIG. 7.

FIG. 7 is a plan view showing another modified example of a nitride based semiconductor device according to the exemplary embodiment of the present invention and FIG. 8 is a cross-sectional view taken along line IV-IV' of FIG. 7.

Referring to FIGS. 7 and 8, a nitride based semiconductor device 100b according to another modified example of the present invention may include an electrode structure 130b having a circular or ring-shaped transverse section different from the nitride based semiconductor device 100 with reference to FIG. 1.

In more detail, the nitride based semiconductor device 100b includes the base substrate 110, the epitaxial growth layer 120 disposed on the base substrate 110, and the electrode structure 130b disposed on the epitaxial growth layer, wherein the electrode structure 130b may include the ohmic electrode 132b disposed in the edge area of the epitaxial growth layer 120 and the schottky electrode 134b surrounded by the ohmic electrode 132b in the central area of the epitaxial growth layer 120. Therefore, the ohmic electrode 132b has a ring shape surrounding the schottky electrode 134b and the schottky electrode 134b may have a plate shape.

Meanwhile, the schottky electrode 134b may have an extension 136b extending into the epitaxial growth layer 120. The extension 136b may be provided in plural. In this case, the extensions 136b may be disposed to be spaced by a predetermined interval along the side of the schottky electrode 134b opposite to the ohmic electrode 132b. The epitaxial growth layer 120 may be provided with the depressing parts 126 into which the extensions 136b are inserted so that the extensions 136b are disposed in the epitaxial growth layer 120. The depressing parts 126 may include a third area 127a into which the extensions 136b are inserted and a fourth area 127b that is an area other than the third area 127a. The fourth area 127b may be provided with the passivation layer 140.

The nitride based semiconductor device according to the exemplary embodiment of the present invention includes the epitaxial growth layer generating the 2-dimensional electron gas therein and the electrode structure disposed on the epitaxial growth layer and extends a portion of the electrode structure into the epitaxial growth layer to contact the 2-dimensional electron gas in order to minimizing a current resistance value through the 2-dimensional electron gas, thereby making it possible to improve the forward operation at the low turn-on voltage.

Further, the nitride based semiconductor device according to the exemplary embodiment of the present invention moves the current through the portion of the electrode structure contacting the 2-dimensional electron gas when the driving voltage is driven at a lower voltage than the turn-on voltage of the schottky diode at the time of the forward operation and moves current through a contact point between the entire schottky electrode and the 2-dimensional electron gas at the time of being driven at voltage higher than the turn-on voltage, thereby making it possible to be operated at the low turn-on voltage and increase the forward current amount.

Further, the nitride based semiconductor device according to the exemplary embodiment of the present invention provides the depressing part on the epitaxial growth layer to disperse the electric field concentrated on the schottky electrode due to the depressing part at the time of the reverse operation, thereby making it possible to increase the reverse withstand voltage.

The above detail description is for illustrating the present invention. In addition, the above-described contents is only for showing and explaining preferred embodiment of the present invention, and the present invention may be used in a variety of other combinations, changes, and environments. In other words, modifications or corrections are possible within the scope of concepts of the invention set forth in the present embodiment, the scope of equivalents to written disclosures set forth in the present embodiment and/or the scope of techniques or knowledge in the art. The above-described embodiments are for explaining the best for implementing the present embodiment. Implementation to other forms known in the art and various modifications required in specific application fields and uses of the present invention are possible. Accordingly, the above detailed description of the present invention has no intent to limit the present invention by the presented embodiments. Also, the accompanying claims should be construed to include other embodiments.

What is claimed is:

1. A nitride based semiconductor device, comprising:
    a base substrate;
    an epitaxial growth layer disposed on the base substrate and generating 2-dimensional electron gas (2DEG) therein; and
    an electrode structure disposed on the epitaxial growth layer and having a schottky electrode the schottky electrode contacting the epitaxial growth layer and an ohmic electrode the ohmic electrode contacting the epitaxial growth layer,
    wherein the epitaxial growth layer includes a depressing part depressed thereinto from the surface of the epitaxial growth layer and the schottky electrode having an extension extending into the depressing part, and
    the depressing part consists of:
    a first area in which the extension is disposed; and
    a second area that is an area other than the first area and is disposed to approach the ohmic electrode, as compared with the first area,
    and wherein lateral surfaces of the extension excepting a lateral surface directed toward the ohmic electrode contact with the 2-dimensional electron gas (2DEG).

2. The nitride based semiconductor device according to claim 1, wherein the epitaxial growth layer includes:
    a lower nitride layer grown on the base substrate using the base substrate as a seed layer; and
    an upper nitride layer disposed on the lower nitride layer using the lower nitride layer as a seed layer and having a wider energy band gap than that of the lower nitride layer,
    the extension extending to the inside of the lower nitride layer, penetrating through the upper nitride layer.

3. The nitride based semiconductor device according to claim 1, further comprising a passivation layer covering the second area.

4. The nitride based semiconductor device according to claim 1, wherein the second area is used as a field plate dispersing an electric field generated at an interface between the schottky electrode and the epitaxial growth layer.

5. The nitride based semiconductor device according to claim 1, wherein
    the schottky electrode has a plurality extensions being locally disposed along the side of the schottky electrode opposite to the ohmic electrode with a predetermined distance between each of the extensions.

6. The nitride based semiconductor device according to claim 1, wherein
    the schottky electrode is disposed in the central area of the epitaxial growth layer,
    the ohmic electrode is disposed along the edge area of the epitaxial growth layer to have a ring shape surrounding the schottky electrode, and
    the schottky electrode has a plurality extensions being locally disposed along the side of the schottky electrode opposite to the ohmic electrode with a predetermined distance between each of the extensions.

7. The nitride based semiconductor device according to claim 1, wherein the depressing part is formed during a mesa process for electrically separating devices.

8. The nitride based semiconductor device according to claim 1, wherein the base substrate includes at least any one of a silicon substrate, a silicon carbide substrate, and a sapphire substrate.

* * * * *